INVENTORS
TOSHIAKI IRIE
KATSUO SATO
BY YOSHIYUKI NANKO

ATTORNEYS
SANDOE, HOPGOOD & CALIMAFDE

INVENTORS
TOSHIAKI IRIE
KATSUO SATO
BY YOSHIYUKI NANKO

ATTORNEYS
SANDOE, HOPGOOD & CALIMAFDE

INVENTORS
TOSHIAKI IRIE
KATSUO SATO
YOSHIYUKI NANKO
BY
ATTORNEYS
SANDOE HOPGOOD + CALIMAFDE

United States Patent Office 3,671,340

Patented June 20, 1972

3,671,340
TRANSISTOR DEVICE WITH PLATEAU EMITTER AND METHOD FOR MAKING THE SAME

Toshiaki Irie, Katsuo Sato, and Yoshiyuki Nanko, Tokyo, Japan, assignors to Nippon Electric Company, Limited, Tokyo, Japan Application May 14, 1969, Ser. No. 827,101, now Patent No. 3,530,343, dated Sept. 22, 1970, which is a continuation of application Ser. No. 571,204, Aug. 9, 1966. Divided and this application Feb. 6, 1970, Ser. No. 9,340

Int. Cl. H01l 7/44

U.S. Cl. 148—187 2 Claims

ABSTRACT OF THE DISCLOSURE

A semiconductor device and a method for making the same, in which diffusion of impurities forming the collector and emitter areas of the device are confined to raised portions of the substrate. Undesired lateral diffusion of the impurities is thus eliminated.

Figure 1A:
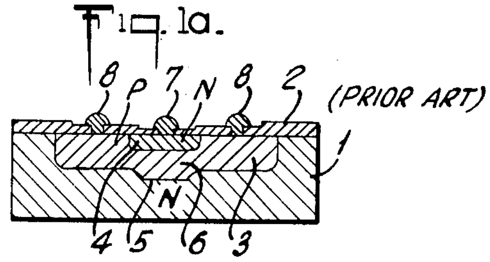

Diffusion of the impurities through the aforementioned raised portions produces collector-base and emitter base junctions which are substantially parallel.

This is a division of application Ser. No. 827,101, filed May 14, 1969, now Pat. No. 3,530,343 which is a continuation of application Ser. No. 571,204, filed Aug. 9, 1966, now abandoned.

This invention relates to a semiconductor device and more particularly to an improved construction of and method for making a double diffusion semiconductor device suitable for high current density operation at high frequency.

Those knowledgeable in the art are aware that a semiconductor device of the planar type has excellent electric characteristics among the double diffusion type semiconductor devices. Planar transistors of the double diffusion type are manufactured by first selectively diffusing an impurity for forming the base region into a semiconductor substrate which serves as the collector and by then further selectively diffusing another impurity into the base region to form the emitter region. During these process steps, the impurity for forming the emitter region is diffused during the second diffusion step not only perpendicularly to the surface of the substrate but also generally parallel to this surface. This side-wise diffusion is an important consideration in determining both the amount of the impurity and the time interval of diffusion. Additionally the side-wise diffusion makes it difficult both to reduce the resistance across the layer of the emitter region and to improve the efficiency of emitter injection.

The impurity for forming the emitter region is generally diffused at the highest possible concentration during the second diffusion step in order to raise the efficiency of the emitter. This makes the rate of diffusion of the impurity greater at the base region portion directly below the emitter region than at the other portions and results in the disadvantage that the collector-base junction becomes uneven. Furthermore, there are other disadvantages in a conventional double diffusion transistor, due to reasons to be later described, which cause the injection of the minority carriers from the portion of the emitter-base region which is not parallel to the surface of the substrate to become dominant. The result is that the electric current is concentrated at this portion with the further result that the transit time of the minority carriers through the base is lengthened, thus reducing the cutoff frequency of the transistor. These disadvantages become more serious in a transistor intended for operation at higher current densities.

Accordingly, it is an object of the present invention to provide a semiconductor device having a construction that will produce excellent electric characteristics and which will eliminate the disadvantages described above.

Another object of this invention is to provide a semiconductor device which maintains the desired excellent electrical characteristics at high current density operation.

A semiconductor device made in accordance with the present invention is characterized in that the semiconductor substrate is provided with a plateau-like protrusion and in that this portion serves as the region for the second diffusion, the extension of the substrate surface beneath the protrusion serving as the junction plane between the regions for the first and second diffusions. Further according to this invention, the second impurity diffusion is restricted within the desired region to form a geometrically even PN junction. This results in the desirable consequence that the electric current does not become concentrated at a particular portion of a junction during operation of the semiconductor device of this invention.

Figure 1B:
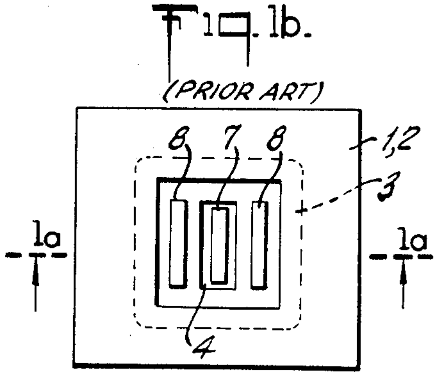
Figure 2A:
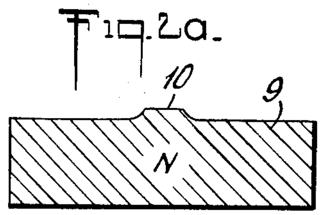
Figure 2F:
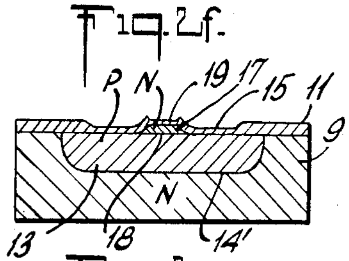
Figure 2B:
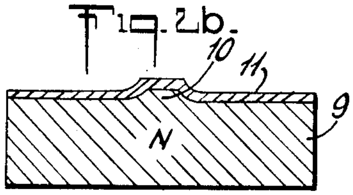
Figure 2G:
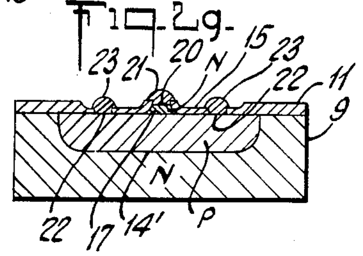
Figure 3:
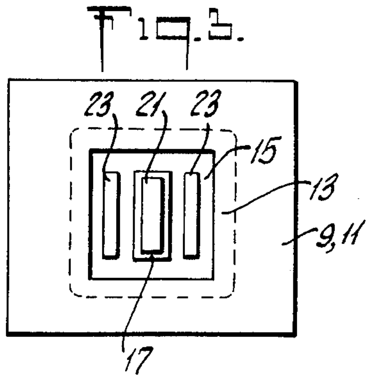
Figures 4A, 4B, 4C, 4D, 5A, 5B, 5C, 5D, 5E, 5F, 5G, 5H, 6:
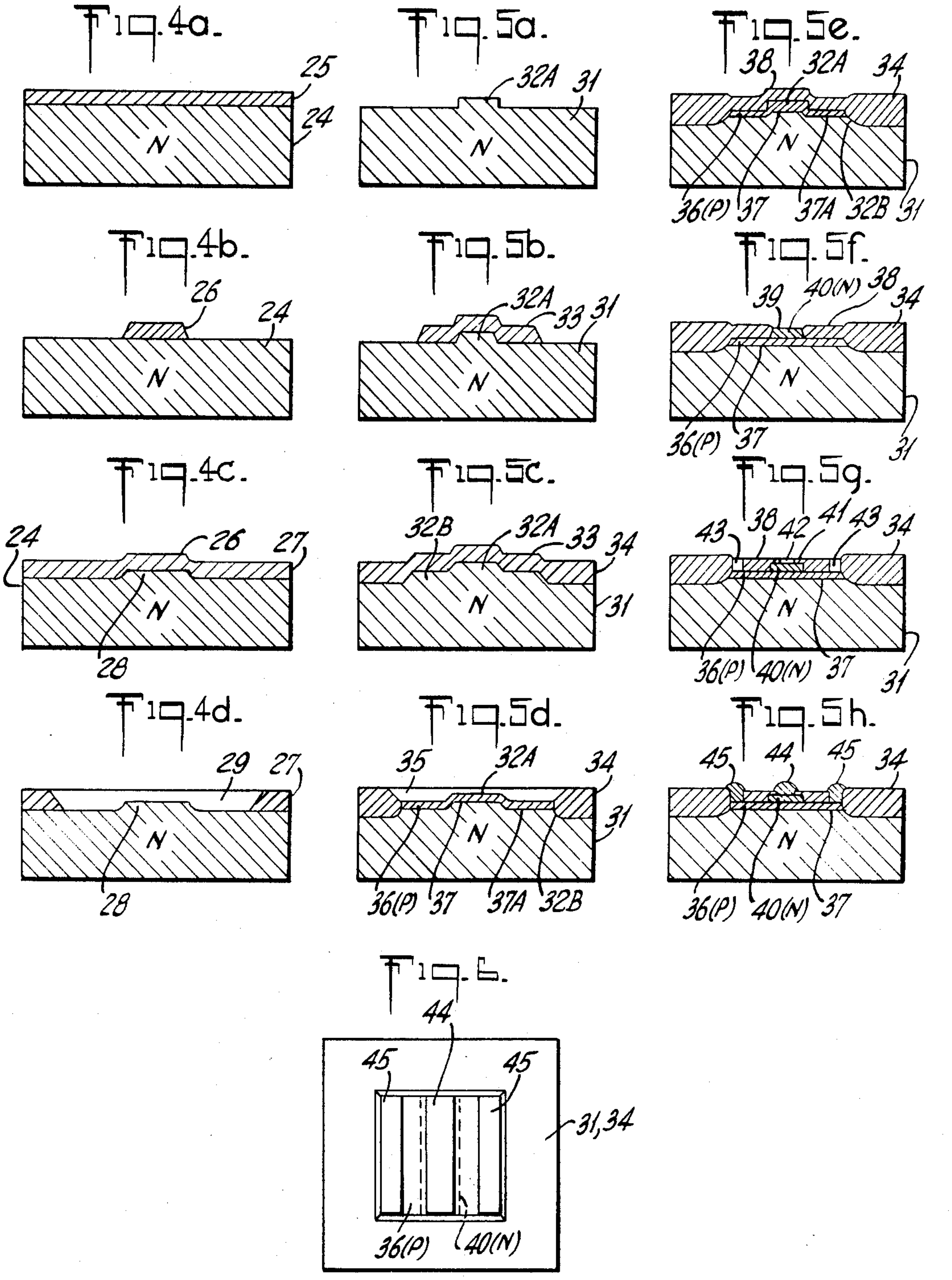
Figure 7A:
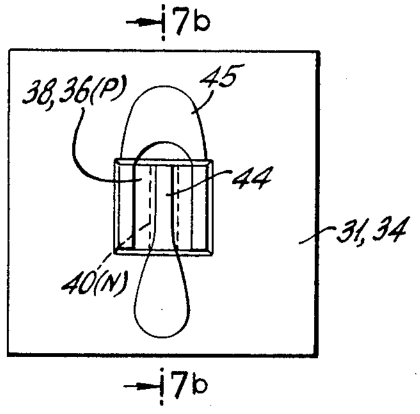
Figure 8A:
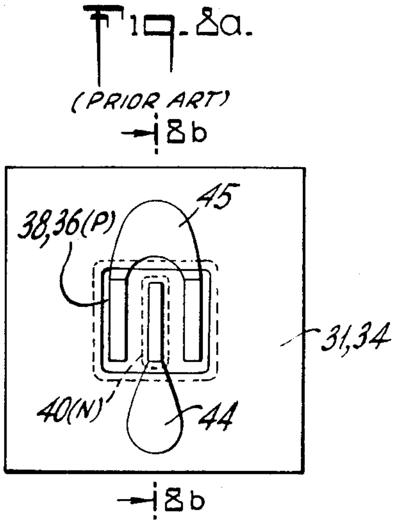
Fig. 8a. (PRIOR ART)
Figure 7B:
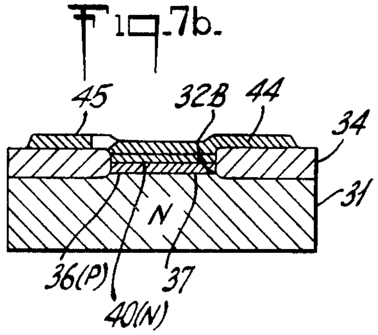
Figure 8B:
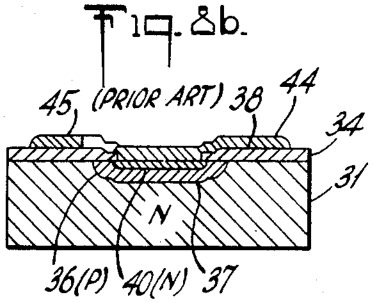

All of the objects, features and advantages of this invention and the manner of attaining them will become more apparent and the invention itself will be best understood by reference to the following description of the invention taken in conjunction with the accompanying drawing, in which:

FIG. 1 shows a conventional NPN double diffusion silicon planar transistor, FIG. 1*b* being a plan view thereof and FIG. 1*a* being a longitudinal sectional view taken on the line 1*a*—1*a* of FIG. 1*b* as seen when looking in the direction of the arrows;

FIGS. 2*a* through 2*g* are longitudinal sectional views illustrating different steps of one process for making a NPN double diffusion silicon transistor according to this invention;

FIG. 3 is a plan view of the transistor shown in FIG. 2*g*;

FIGS. 4*a* through 4*d* are longitudinal sectional views useful in explaining processes which may be substituted for those illustrated by FIGS. 2*a* and 2*b*;

FIGS. 5*a* through 5*h* are longitudinal sectional views which illustrate different steps of another process for making an NPN double diffusion silicon transistor according to this invention;

FIG. 6 is a plan view of the transistor shown in FIG. 5*h*;

FIG. 7 shows another embodiment of a semiconductor device of this invention wherein lead wire members are employed, FIG. 7*a* being a plan view and FIG. 7*b* being a cross-sectional view taken on the line 7*b*—7*b* of FIG. 7*a*; and FIG. 8 illustrated a semiconductor device having a conventional lead wire arrangement for comparison with that of this invention, FIG. 8*a* being a plan view and FIG. 8*b* being a cross-sectional view taken on the line 8*b*—8*b* of FIG. 8*a*.

Referring now to FIG. 1, a conventional double diffusion semiconductor device will first be described. In this figure, the device comprises a conventional NPN double diffusion planar transistor having a substrate 1 of single crystal N type silicon serving as the collector, a P type base region 3 formed by diffusion of a first impurity into the substrate 1 and an N type emitter region 4 formed by diffusion of a second impurity within the base region. The top surface of the device is even and is covered with a silicon oxide coating 2 except for portions in selected areas for connection of the electrodes. At the emitter and the base regions 4 and 3, emitter and base electrodes 7 and 8 respectively, are attached to the surface of the substrate 1.

Such a conventional transistor may have a substrate resistivity of the order of 1 ohm-cm., impurity concentrations of the order of $3\times10^{19}$ cm.$^{-3}$ and $2\times10^{20}$ cm.$^{-3}$ respectively, at the surface portions of the P type base region 3 and the N type emitter region 4, a collector-base junction depth of the order of 0.5 micron, a base width of the order of 0.35 micron, and a collector-base junction indentation 5 having a depth of the order of 0.3 micron.

Such a conventional double diffusion type transistor presents the following problems:

(1) During the second diffusion step which forms the emitter region 4, it is necessary to diffuse a sufficient amount of the N type impurity to reverse the P type conductivity within the base region 3. This diffusion takes place not only in the direction perpendicular to the surface of the substrate 1 but also parallel thereto, i.e. sidewise diffusion. Because of this side-wise diffusion, it becomes necessary to supplement or increase the amount of the N type impurity to insure proper diffusion.

With the structure of this invention, the portion corresponding to the emitter region 4 shown in FIG. 1*a* is preliminarily formed on the surface of the substrate into a plateau-like protrusion and the N type impurity for the emitter region is diffused through a hole formed in a silicon oxide coating which has approximately the same area as the surface area of the protrusion. The side-wise diffusion is therefore restricted, thus reducing the amount of the impurity required. This results in a reduction of the resistance of the emitter region and also improves the emitter injection efficiency.

(2) In the diffusion step for forming the emitter region 4 of the conventional diffusion type transistor, the impurity concentration is generally increased to the highest permissible concentration to achieve higher emitter efficiency. The concentration of the impurity in the base region 3 is also increased in order to strengthen the drift electric field and to reduce the base resistance. However, when the impurity, such as phosphorus, for example, is diffused at high concentrations during the emitter region diffusion step, disturbance of the crystalline structure near the emitter region results and augments the rate of diffusion of the impurity at the portion near the collector-base junction which is immediately below the emitter region. This phenomenon is not perceptible when the impurity concentration of the base region is lower than approximately $10^{18}$ cm.$^{-3}$. The concentration must, however, be made higher than this value in order to obtain a sufficiently low base resistance. As a result, the base region portion 6 immediately below the emitter region undergoes a higher rate of diffusion of the P type impurity than the other portions. This produces the indentation 5 of the collector-base junction seen in FIG. 1*a*.

With the structure and the method of this invention wherein the portion for the emitter region is preliminarily formed as a plateau-like protrusion, the above-mentioned phenomenon which appears during diffusion of the impurity for the emitter region does not result in the undesired indentation 5 of the collector-base junction, as seen in FIG. 1*a*, but instead results in the formation of a collector-base junction which is substantially parallel to the emitter-base junction at the portion where the indentation would otherwise be formed.

(3) In the operation of a transistor of the type described, the resistance spread of the base generally causes a greater bias of the emitter region at the portion thereof which is nearer to the base electrode. This phenomenon becomes more serious as the electric current increases, so that the current is more concentrated at that portion of the emitter region which is nearer to the base electrode. In a conventional double diffusion transistor such as that shown in FIG. 1, it has been recognized that the above described electric current concentration phenomenon causes the electric current flowing into the emitter region 4 at the side portions to become dominant and consequently lengthens the path of the minority carriers in traveling to the collector-base junction. This results in a conventional double diffusion transistor wherein the impurity distribution concentration in the base region 3 is higher at the portion nearer to the surface of the substrate 1, and in reduction of the emitter injection efficiency, which causes a further concentration of the electric current. The lengthening of the current path of course results in a lengthening of the time for the minority carriers to transit the base. This seriously reduces the efficiency of transportation of the carriers and lowers the cut off frequency. In short, the structure of a conventional double diffusion transistor is extremely disadvantageous in that the desired characteristics at higher current-density operation cannot be realized.

The present invention is very effective in eliminating the above-mentioned defects. More particularly, the substantial parallelism created between the emitter-base and the collector-base junctions introduces very little variation into the current path and scarcely reduces the emitter injection efficiency, although an increase of the electric current may result in some concentration thereof.

(4) In a transistor used at high frequencies, the area of the emitter is considerably reduced in order to raise the cut off frequency. This results in the capacity of the collector-base junction portion, due to the structure of the conventional transistor and the method of making the same, being much greater than that portion of the collector-base junction that is indispensable as the domain of activity of the minority carriers. Furthermore, the extremely small dimensions of the device make it difficult in the course of assembly to connect the lead wires directly with the electrodes of the semiconductor element and usually necessitate, in a planar transistor, provision of lead-out members with which the lead wires are to be connected. In short, the capacity of the collector-base junction which is inevitably widened because of the structure of the conventional transistor and the method of making the same, and the additional capacity resulting from the lead-out members, seriously affects the high-frequency parameter of the transistor and markedly degrades the characteristics in the higher frequency range.

This invention exhibits the further remarkable technical merit of obviating the above-mentioned degradation or deterioration of characteristics. More particularly, in accordance with this invention, most of the collector-base junction portion added on account of the structure of a conventional planar transistor and the method of making the same is eliminated, thus preventing deterioration of the higher frequency power gain. Moreover, the undesired capacity present between the lead-out members and the collector electrode is very small because the intervening silicon oxide coating is relatively thick, and consequently the further reduction of the high-frequency power gain and the resulting unstability of the gain encounterd with conventional transistors in now eliminated. The structure of this invention is still further advantageous in that the substantial flatness of the surface of the semi-conductor element made possible with the structure of this invention enables the lead-out members to be provided with great ease, thereby facilitating manufacture.

FIGS. 2*a*–2*g* illustrate the marking of one semiconductor device of this invention at different stages during its manufacture. Referring now specifically to FIG. 2*a*, at the start of the manufacturing process, an N type silicon substrate 9 is provided, which may have a resistivity of 1 ohm-cm. This substrate 9 is provided with a protrusion 10 approximately 50 microns long and 4 microns wide.

The protrusion 10 may be formed by various known techniques, such as for example, epitaxial growth, etching by hydrogen chloride or other etchants, or electron beam forming. For a very small element such as is used for an ultra-high frequency transistor, preferred methods are heat-etching in an atmosphere containing hydrogen chloride or utilizing the difference in the speed of growth of the silicon oxide coating in the manner to be later described with reference to FIGS. 4*a*–4*d*. The dimensions of the protrusion 10 are determined, as will appear below, by the desired area of the emitter region, the depth of the emitter diffusion, and the width of the base. Thus for instance, if the diffusion is carried out under the condition already explained with reference to FIG. 1, then the depth of the emitter region would be 0.45 micron. Consequently, the protrusion 10 should be 0.4 micron high and as wide as the desired area of the emitter region. Although FIG. 2*a* shows an example comprising a substrate 9 provided with only one protrusion 10 for one emitter, it will be appreciated that for two or more emitters a corresponding number of protrusions 10 would be provided.

As shown in FIG. 2*b*, the surface of the N type substrate 9 having the protusion 10 is now covered with a silicon oxide coating 11 having a thickness of 0.8 micron. This may be accomplished by any of the known methods, such as vacuum evaporation, thermal decomposition of an organic silicon compound, or heat treatment of the substrate 9 in an oxidizing atmosphere.

Figure 2C:
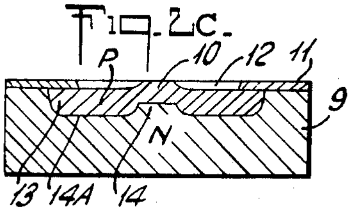

Referring next to FIG. 2*c*, the silicon oxide coating 11 is then provided with an aperture or hole 12 by photoetching at the portion covering the protrusion 10. A P type impurity is then diffused through the hole 12 to form the base region 13 and the collector-base junction 14A adjacent thereto.

When the dimensions of the holes 12 are made 48 microns by 62 microns, the surface concentration of the P type impurity is $3\times10^{19}$ cm.$^{-3}$ and the depth of the base region 13 is 0.5 micron, the impurity diffusion, by its nature, results in a ridge 14 which extends upwardly of the substrate 9 at the portion of the collector-base junction which lies immediately below the protrusion 10. The height of the ridge 14 is generally equal to that of the protrusion 10 and is consequently approximately 0.4 micron.

The emitter-base junction is next formed by diffusing an N type impurity. This may be accomplished by means of selective diffusion, which may be done by first covering the portion not required for the emitter with another silicon oxide coating in known manner.

Figure 2D:
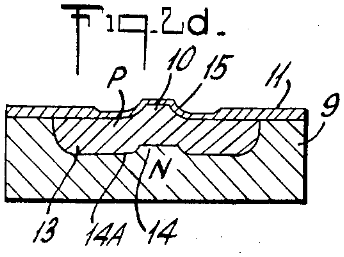

In FIG. 2*d*, a further silicon oxide coating 15 is shown at the portion comprising the hole 12 of FIG. 2*c*. This latter coating may be formed in like manner as explained with reference to FIG. 2*b*.

Figure 2E:
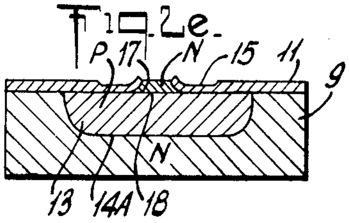

As shown in FIG. 2*e*, the silicon oxide coating 15 shown in FIG. 2*d* is provided, preferably by photoetching with a hole 16 having dimensions of 4 microns by 60 microns, in registry with the upper surface of the protrusion 10. Through this hole 16 an N type impurity is diffused to form an emitter region 17 and an emitter-base junction 18. In carrying out this emitter diffusion, a sufficient amount of impurity must generally be diffused to cancel the P type impurity of the base. It is therefore usual that the concentration of the N type impurity is very high. Inasmuch as the surface concentration of the P type impurity is $3\times10^{19}$ cm.$^{-3}$, a concentration of $2\times10^{20}$ cm.$^{-3}$ is chosen for the N type impurity. As alluded to above, diffusion of an impurity of such a high concentration results in disturbance of the crystalline structure, which effectively makes the rate of diffusion of the impurity greater in the region adjacent to the emitter region than elsewhere. Consequently, the process of emitter diffusion simultaneously diffuses the P type impurity existing at the base region portion immediately below the emitter region farther than that contained at the other portions.

When 0.45 micron and 0.35 micron are selected for the depth of the emitter region and the width of the base, respectively, the foregoing emitter diffusion causes lowering of the ridge 14 of the collector-base junction 14A shown in FIG. 2*d* by an amount of the order of 0.3 micron, so that this ridge is then at the level indicated by the numeral 14A shown in FIG. 2*e*. As a result, the entire collector-base junction 14A facing the emitter-base junction 18 becomes substantially precisely parallel to the latter junction 18 compared with the construction of the prior art transistor shown in FIG. 1.

Another important point is to form the emitter-base junction 18 within the protrusion 10 shown in FIG. 2*d*, or, at least so that it is in substantial alignment with the bottom interface thereof. When the emitter-base junction 18 is lower than the bottom interface of the protrusion 10, all of the objects of the invention are not achieved to the fullest extent; however the resulting device is nevertheless far superior to the conventional transistor. Furthermore, it is important, in order to obtain true parallelism between the junctions, that the dimensions of the protrusion 10 shown in FIG. 2*a* be determined with proper consideration of the depth and the time duration of diffusion of the impurity for forming the emitter region, the width of the base, and other factors of design, as has been exemplified herein by a specific set of values.

The subsequent process steps relating to FIGS. 2*f* and 2*g* differ little from the corresponding steps for a conventional planar transistor. In FIG. 2*f*, the numeral 19 illustrates a third silicon oxide coating covering the hole 16 provided for diffusing the N type impurity shown in FIG. 2*e*. The thickness of this silicon oxide coating may be of the order of 0.5 micron.

Referring now to FIG. 2*g*, the third silicon oxide coating 19 is provided with a hole 20 slightly smaller than the area of the emitter region 17, through which hole an emitter electrode 21 is brought into contact with the emitter region 17. Also, the second silicon oxide coating 15 covering the base region 13 is provided with holes 22 through which base electrodes 23 are connected with the base region 13. The dimensions of the hole 20 are of the order of 2–3 microns in width and 45 microns in length. The emitter and the base electrodes 21 and 23 are preferably, although not necessarily, made of aluminum.

FIG. 3 is a plan view of the embodiment of this invention seen in cross-section in FIG. 2*g*. The electrode for the collector region 9 may be attached to this region either at the bottom portion thereof or through a hole formed through the oxide coating 11 covering the same, as desired.

Referring now to FIGS. 4*a* through 4*d*, one of the preferred methods will now be explained for forming the protrusion 10 shown in FIGS. 2*a*–2*d*. This method is suitable to particularly small elements, such as those employed for ultrahigh frequency transistors.

First, an N type semiconductor substrate 24 is covered, as shown in FIG. 4*a*, with a silicon oxide coating 25. The thickness of the coating 25 is determined in the manner described hereunder and depends upon the desired height of the protrusion 10 shown in FIGS. 2*a*–2*d*. Portions of this silicon oxide coating 25 are then removed, as by photoetching or electron-beam bombardment, leaving the portion 26 remaining as shown in FIG. 4*b*. The dimensions of the remaining portion 26 are determined in accordance with the area required for the emitter. For the embodiment explained with reference to FIG. 2*a* wherein the area of the emitter is 4 microns by 50 microns, the remaining portion 26 should correspond thereto in area. Alternatively, the silicon oxide coating may be formed only at the portion 26 through vacuum evaporation, thermal decomposition of an organic silicon compound, or the like.

The intermediate product shown in FIG. 4*b* is heated in an oxidizing atmosphere at 900°–1200° C. to oxidize the surface portion of the silicon substrate into silicon oxide coating as seen in FIG. 4*c*. With this method for growing a silicon oxide coating, it is already known that the thickness of the growth is proportional to the root of the time duration of oxidation. Thus, it is possible to make the increment of the grown coating considerably greater at portions other than the preliminarily formed silicon oxide coating portion 26 than at that portion 26 and to keep the thickness of the silicon oxide coating portion 26 substantially unchanged when the same is relatively thick.

As one example, a protrusion having a height of 0.4 micron is obtainable by growing in an oxidizing atmosphere at 1140° C. the silicon oxide coating 27 at the surface portion of the silicon substrate other than the portion 26, up to a thickness of 1.4 microns. The grown oxide coating is formed, as is already known, on the top and bottom surfaces of the silicon substrate before being covered with the grown coating, in the ratio of 44%±2%, and 56%±2%, namely about 0.62 micron and 0.78 micron, respectively. If the partial oxide coating 26 is 2 microns thick, the grown oxide coating assumes at this portion a thickness of about 0.5 micron and extends downwardly into the silicon substrate about 0.22 micron. As a result, the interface between the silicon substrate 24 and the silicon oxide coatings 26 and 27 is provided with a plateau-like protrusion shown in FIG. 4*c* whose height is the difference between 0.62 micron and 0.22 micron, namely the desired value of 0.4 micron. By removing the coatings 26 and 27 through etching, a protrusion 28 on the surface of the silicon substrate 24 will have been formed.

It will be understood that the above process steps produce a protrusion of the same shape as that shown in FIG. 2*a*. If it is required to simplify the process, a hole 29 shown in FIG. 4*d*, may be formed by photoetching, after the completion of the process illustrated with reference to FIG. 4*c*, for use in diffusing the impurity for the base region. The hole 29 corresponds to the hole 12 of FIG. 2*c*.

According to the foregoing embodiment of this invention, it is possible first to prevent the side-wise diffusion of the prior art emitter-region diffusion step by diffusing the impurity into the protrusion 10 through the hole 16 having the same area as the protrusion. This makes it unnecessary to supplement the amount of the impurity consumed by the side-wise diffusion. Further advantages are a consequent reduction in the body resistance of the emitter region and improved emitter injection efficiency.

Secondly, the preliminary provision of the protrustion 10 for the emitter region 17 prevents the inevitable shift of the base-collector junction during the emitter-region diffusion from resulting in the serious indentation produced in the conventional device and as a result substantial parallelism between the emitter-base junction and the collector-base junction is achieved.

Thirdly, the substantial parallelism of the emitter-base and the collector-base junctions causes the path of the electric current to vary very little, even if concentration may result from an increase in the current. This also protects against any decrease in the emitter-injection efficiency which has been unavoidable in the conventional devices. Thus, the above embodiment having an emitter area of 4 microns by 50 microns exhibited an $I_{C.max}$ of approximately 1.5–1.8 times that of the conventional structure shown in FIG. 1. This embodiment with the same emitter area also had an improved $f_T$ approximately 1.3–1.5 times that of the conventional structure. Furthermore, the device of this invention exhibited a high frequency noise figure of 2.0–2.5 db at 200 mc. whereas that of the conventional structure is approximately 3.5 db. It will be appreciated that this invention is useful in raising the output at the higher frequencies by increasing the number of emitters and also that the high frequency noise figure can be improved by division of the emitter area.

FIGS. 5*a*–5*h* illustrate the manufacture of a semiconductor device according to another embodiment of the invention. Referring more particularly to FIG. 5*a*, an N type silicon substrate 31 is provided at its surface with a first plateau-like protrusion 32A. As in the embodiment of FIG. 2, this protrusion 32A may be formed by various known techniques, such as mesa etching, epitaxial growth, electron beam bombardment, vacuum evaporation, or through the selective growth of a silicon oxide coating. The area and the height of the protrusion 32A are determined by the desired area and depth of the emitter region, respectively. As one example, the selection of a 1 ohm-cm. resistivity for the N type substrate 31, $3\times10^{19}$ cm.$^{-3}$ for the surface concentration of the impurity for the P type base region 36, $2\times10^{20}$ cm.$^{-3}$ for the surface concentration of the impurity for the emitter region 40, 0.5 micron for the depth of the collector-base junction, and 0.35 micron for the width of the base, results in an emitter region 40 having a depth of approximately 0.45 micron. The protrusion 32A should then be 0.4 micron high and as wide as the emitter area. Although only one emitter is shown throughout FIG. 5, two or more may, of course, be formed simultaneously.

Referring now to FIG. 5*b*, a silicon oxide coating 33 is next provided in order to develop the formation of a second protrusion defining the collector-base region, over that surface portion of the substrate 31 which includes the first protrusion. This coating 33 is as wide as the surface area of the second protrusion to be formed. Inasmuch as this second protrusion serves the formation of the collector-base region, the area should be as wide as the desired area of the collector-base junction. Thus, for example, if the area of the collector-base junction is to be 48 microns by 62 microns, the coating should be as wide as the area plus the thickness of the coating. The thickness of the coating 33 is determined by the height of the protrusion and is preferable made relatively thick. As one exemplary guide, if the second protrusion is to be 1 micron high, the thickness should be generally about 3 microns.

The coating 33 may be formed either by first heating the substrate 31 in an oxidizing atmosphere to cover the surface with a silicon oxide coating or by thermally decomposing a silicon compound to deposit such a coating. Next, that portion of the coating formed over the surface of the substrate 31 which does not include the first protrusion 32A is then removed, as by photoetching.

The resulting structure shown in FIG. 5*b* is then heated to 900°–1200° C. in an oxidizing atmosphere. This results in oxidation of the silicon surface and the formation of a new silicon oxide coating. Since, as noted above, it is known that the thickness of the silicon oxide coating so grown is proportional to the root of the time duration of oxidation, the thickness of the coating at the portion where the silicon oxide coating 33 was not present is far greater than the increment of the thickness of the coating at the portion where the coating 33 previously existed. Where the remaining portion of the oxide coating 33 is particularly thick, it is possible to effect substantially no change of the thickness thereat during the latter described oxide growth step. In this connection, it is known that the silicon oxide coating 34 formed on the silicon surface portion other than the residue coating 33 is formed to a point below the original surface and also above the surface by 44%+2% and 56%+2%, respectively. As a result, the silicon surface not covered with the grown silicon oxide coating is shaped into the second protrusion 32B as shown in FIG. 5*c*. As one example, when the residue coating is 3 microns thick and the second oxide coating is grown at 1140° C. in an oxidizing atmosphere to a thickness of 2 microns at the surface portion not covered with the residue coating 33, the resulting second protrusion becomes approximately 0.65 micron high.

One of the salient features of this invention is to employ in the manner described above the difference of the rate of growth of a silicon oxide coating on the surface of a silicon body, in forming a plateau-like protrusion defined by the already existing silicon oxide coating. Use of the known mesa itching is disadvantageous because it is impossible to stabilize the surface and to form the lead-out members.

After the second protrusion 32B is formed, the oxide coating is removed by photoetching at the surface portions of the first and the second protrusion 32A and 32B throughout the same area as the collector junction, i.e., the area of the dimensions 48 microns by 62 microns wide, cited above. Through a hole 25 formed by such removal, as seen in FIG. 5*d*, a P type impurity such as boron is diffused to form the base region 36 having a surface impurity concentration of $3\times10^{19}$ cm.$^{-3}$. Although the collector-base junction may be formed within the second protrusion 32B, or generally at the bottom thereof, or below the same, this junction lies within the protrusion in the embodiment illustrated in FIG. 5. At the stage of manufacture represented by FIG. 5*d* the collector-base junction 37A includes a protrusion 37 at the portion situated just below the first plateau-like protrusion 32A.

Referring now to FIG. 5*e*, a third silicon oxide coating 38 is formed on the surface of the base region 36 so as to fill the hole 35 formed by removal of the second oxide coating as shown in FIG. 5*d*. This may be accomplished by thermal decomposition of a silicon compound or by growth resulting from heat treatment in an oxidizing atmosphere. For a semiconductor device having lead-out members, it is desirable to align the surface of the third coating 38 with the portion of the surface of the silicon oxide coating 34 remaining on the collector region. When the second coating 34 is made approximately 2 microns thick, the third coating 38 is preferably 1 micron thick. To align the surfaces, thermal decomposition of the silicon compound is suitably employed. In carrying out the decomposition, the thickness of the coating 34 shown in FIG. 5*d* is reduced by etching to lower the surface down to the level of the surface of the second protrusion, and then the coating is grown on the entire surface of the substrate 31 thus treated.

Referring to FIG. 5*f*, the emitter region 40 is formed within the base region 36. This is accomplished by first removing through photoetching the portion of the silicon oxide coating 38 which lies on the surface of the first protrusion 32A and then diffusing an N type impurity through the hole 39 thus formed. The hole should be as wide as the upper surface portion of the first protrusion 32A which serves as the emitter area and may have, for instance, an area of 4 microns by 50 microns.

During this process, the P type impurity which is present directly under the emitter region 40 has a greater effective rate of diffusion and is diffused farther than that in the other portions already described in connection with the second feature. As a result, the portion indicated by the numeral 37 in FIG. 5*e* becomes lowered to the portion indicated by numeral 37 in FIG. 5*f* so that the collector-base junction becomes parallel to the emitter-base junction.

It is important to form the emitter-base junction either in alignment with or above the bottom interface of the first protrusion 32A. Positioning this junction below the bottom interface of the protrusion 32A interferes with fully achieving the objects of this invention.

As one illustration, diffusion carried out according to the numerical examples given above results in an emitter region having a depth of 0.45 micron and a base region having a width of 0.35 micron; it also results in formation of the collector-base junction portion indicated by the numeral 37 at a level of 0.8 micron below the top surface of the first protrusion 32A and the other collector-base junction portion 37A at a level of 0.5 micron below the top surface of the second protrusion 32B. As a result, the collector junction, which in the prior art included an indentation or undulation portion, is now substantially smooth within an error of approximately 0.1 micron. This is a very substantial reduction in the indentation or undulation down to approximately one-third, as the height or thickness thereof in the conventional device shown in FIG. 1 is approximately 0.3 micron.

FIG. 5*g* shows another silicon oxide film 41 formed to fill the hole 39 from where the second silicon oxide coating was removed for forming the emitter region 40, a hole 42 provided by photoetching through the newly formed coating for attaching the emitter electrode, and two more holes 43 similarly provided for use in connecting aluminum electrodes with the base region 36.

FIG. 5*h* shows the finished transistor obtained by attaching an emitter electrode 44 and base electrodes 45 through the holes 42 and 43, respectively. A plan view showing the transistor of FIG. 5*h* is seen in FIG. 6.

Comparison of the conventional device of FIG. 1 with the embodiment of this invention has already been made concerning a number of advantages discussed above. Further comparison will now be made with respect to the fact that it is possible by means of this invention to reduce the size of the collector-base junction, which inevitably becomes relatively wide due to the structure of the conventional planar transistor shown in FIG. 1 and also due to the method of making the same.

When the spacing between the base electrodes 45 is the same both for the structure and the method according to this invention and for the conventional structure and method, and the length of the emitter region 40 and the longitudinal length of the base electrodes 45 are also the same for both, (as for instance, when the emitter area is 4 microns by 50 microns and each of the base electrodes also has this area) the smallest area of the collector-base junction indispensable for proper operation is as shown in FIG. 6. From this figure it will be seen that the same comprises an area surrounded by the outer sides of the base electrodes 45 and the lines connecting both ends of those outer sides so that, if each of the spacings between the emitter region and the base electrodes on both sides is 5 microns, an area of 23 microns by 50 microns is sufficient. According to the conventional method and structure, considerable attention must be paid to forming the holes 43 and 42 for the base and the emitter electrodes 45 and 44 so that even a portion of these holes may not cover the end of the collector-base junction appearing at the surface of the substrate. This is also true regarding formation of the hole for preparing the emitter region 40. This inconvenience results mainly from the fact that the emitter-base and the base-collector junctions of a conventional planar transistor appear on a single plane of the original surface of the substrate. Thus, it is necessary according to the conventional method and structure to select a sufficient area for the base region to provide room for arranging the holes out of registry with the end of the collector-base junction. In case the normal allowance for the out-of-registry arrangement is 2 microns, the entire space provided should be about 3 microns. The total area then becomes equal to the above dimensions plus 3 microns on all sides, namely 29 microns by 56 microns. These spaces are entirely unnecessary for the operation of a transistor. By contrast, the method and structure of this invention, wherein the ends of the junctions are not on a single flat plane, not only obviate the spare base area but also contribute to improvement of the characteristics.

In FIGS. 7 and 8, the same reference numerals denote similar parts as in FIGS. 5 and 6. The different views of FIG. 7 illustrate one lead wire arrangement in accordance with the invention while those of FIG. 8 illustrate the lead wire arrangement employed in conventional devices for purposes of comparison.

Referring now specifically to FIG. 7, the silicon oxide coating 38 covering the second protrusion 32B has a thickness of the same order as that in a conventional planar transistor and is approximately 1.0–1.2 microns thick. The coating 34 over the collector region is made relatively thick as a natural result of the method of this invention and is preferably made twice as thick as the conventional device coating to provide a substantially smooth coating surface. With the conventional method illustrated in FIG. 8, it is necessary to specially thicken the coatings 38 and 34 to make them as thick as in this invention, if it is desired to obviate the adverse effects described above, which arise from the existence of the lead-out members. The thickness of the coating 38, however, is of the order of 1 micron at its thickest part in a high-frequency transistor wherein the hole for the connection of the emitter electrode 44 or the base electrode 45 is as narrow as several microns. If only the coating 34 is made thick, a further step is employed between deposition of the same and the coating 38 to make the lead-out members. It is well known that the coating 34 of conventional devices is at the most 1.2 times as thick as the coating 38. In contrast, it is possible with this invention to eliminate the further step referred to and to provide a thicker coating 34 by raising the height of the second protrusion 32B. Thus, this invention makes it possible to minimize the stray capacities which are present between the substrate 31 and the base electrode 45 and between this substrate and the emitter electrode 44, and to improve the stability of the power gain in the high frequency range otherwise adversely affected by such stray capacities.

Although this invention has been described in conjunction with transistors, it will be understood that the stray capacity of an integrated circuit may be reduced in like manner. Also, it is to be clearly understood that the numerical values, the conductivity type of each region, and the construction of the electrodes have been cited as mere examples and that these may be altered, depending upon the particular results desired.

While the foregoing description sets forth the principles of the invention in connection with specific apparatus, it is to be understood that the description is made only by way of example and not as a limitation of the scope of the invention as set forth in the objects thereof and in the accompanying claims.

We claim:

1. A method of manufacturing a semiconductor device which comprises the steps of preparing a silicon substrate; forming a preliminary silicon oxide coating on a selected portion of the surface of said substrate; oxidizing the total area of the surface of said substrate including said selected portion by heating said substrate in an oxidizing atmosphere, thereby forming a plateau-like protrusion defined by the area of said preliminary coating due to the difference in the rate of oxidation between said selected coating portion and the other parts of the surface of said substrate; removing the portions of said silicon oxide coating which cover said protrusion and its circumference so as to form a first opening in said silicon oxide coating; forming a region of a first conductivity type and a first P-N junction within said substrate by diffusing an impurity of said first conductivity type through said first opening; forming a second silicon dioxide coating at said first opening; removing said second coating at the covering of said protrusion to form a second opening in said second coating; forming a region of a second conductivity type and a second P-N junction in alignment with or above the bottom interface of said protrusion by diffusing an impurity of said second conductivity type through said second opening, so that said second P-N junction is substantially parallel with the upper surface of said protrusion and with said first P-N junction; forming a third silicon dioxide coating on the upper surface of said protrusion; removing the portions of said silicon oxide coatings which respectively overlie said first and second conductivity type regions; and connecting electrodes to said first and second conductivity type regions through passages created in said silicon oxide coatings as a result of said last-mentioned removing step.

2. A method for making a semiconductor device which comprises the steps of forming a first plateau-like protrusion on the surface of a silicon semiconductor substrate;

forming a preliminary silicon oxide coating on the surface portion of said substrate which includes said first protrusion, oxidizing the substrate thus treated by heating the same in an oxidizing atmosphere to form a second plateau-like protrusion defined by the area of said preliminary coating as a result of the difference between the rate of oxidation at the surface portion of said substrate covered with said preliminary coating and the rate of oxidation at the remaining surface portion of said substrate, removing the portions of the silicon oxide coatings which cover said first and second protrusions to form a hole in said coating, forming a region of a first conductivity type and a first P-N junction within said substrate by diffusing an impurity of a first conductivity type through said hole, forming a second silicon coating at said hole, removing said second coating at the portion covering said first protrusion to form a hole in said second coating, forming a region of a second conductivity type and a second PN junction by diffusing an impurity of a second conductivity type through the hole in said second coating, so that this junction is substantially parallel with the upper surface of said first protrusion and also in substantial registry with the bottom interface of said first protrusion and consequently substantially parallel to said first P-N junction, forming another silicon oxide coating on the upper surface of said first protrusion, removing the portions of the silicon oxide coatings which substantially overlie said first and second conductivity type regions, and connecting electrodes to said first and second conductivity type regions through passages created in the oxide coatings by said last-mentioned removal step.

References Cited

UNITED STATES PATENTS

| | | | |
|---|---|---|---|
| 3,275,845 | 9/1966 | Csanky | 317—235 X |
| 3,491,434 | 1/1970 | Cunningham et al. | 148—186 |

JOHN F. CAMPBELL, Primary Examiner

W. TUPMAN, Assistant Examiner

U.S. Cl. X.R.

29—580